(12) United States Patent
Wang et al.

(10) Patent No.: US 11,312,655 B2
(45) Date of Patent: Apr. 26, 2022

(54) DIVALENT MANGANESE-DOPED ALL-INORGANIC PEROVSKITE QUANTUM DOT GLASS AND PREPARATION METHOD THEREOF

(71) Applicant: SUN YAT-SEN UNIVERSITY, Guangdong (CN)

(72) Inventors: Jing Wang, Guangdong (CN); Jinbo Yu, Guangdong (CN); Luyu Cao, Guangdong (CN); Shuaichen Si, Guangdong (CN)

(73) Assignee: SUN YAT-SEN UNIVERSITY, Guangdong (CN)

( * ) Notice: Subject to any disclaimer, the term of this patent is extended or adjusted under 35 U.S.C. 154(b) by 413 days.

(21) Appl. No.: 16/607,362

(22) PCT Filed: Mar. 28, 2018

(86) PCT No.: PCT/CN2018/080921
§ 371 (c)(1),
(2) Date: Oct. 23, 2019

(87) PCT Pub. No.: WO2019/183840
PCT Pub. Date: Oct. 3, 2019

(65) Prior Publication Data
US 2020/0131081 A1 Apr. 30, 2020

(51) Int. Cl.
*C03C 4/12* (2006.01)
*C03C 14/00* (2006.01)
(Continued)

(52) U.S. Cl.
CPC .............. *C03C 14/006* (2013.01); *C03C 4/12* (2013.01); *C09K 11/02* (2013.01); *C09K 11/662* (2013.01);
(Continued)

(58) Field of Classification Search
CPC ..... C03C 14/006; C03C 4/12; C03C 2214/30; C09K 11/02; C09K 11/662
(Continued)

(56) References Cited

U.S. PATENT DOCUMENTS

2021/0292642 A1* 9/2021 Li .................. C09K 11/883
2021/0348051 A1* 11/2021 Zhang ............. C09K 11/883
2021/0388261 A1* 12/2021 Carroll ............ C01G 21/006

FOREIGN PATENT DOCUMENTS

CN           106927683         7/2017

OTHER PUBLICATIONS

"International Search Report (Form PCT/ISA/210) of PCT/CN2018/080921," dated Jan. 3, 2019, with English translation thereof, pp. 1-6.
(Continued)

*Primary Examiner* — Christopher M Raabe
(74) *Attorney, Agent, or Firm* — JCIPRNET

(57) ABSTRACT

The present invention relates to a divalent manganese-doped all-inorganic perovskite quantum dot glass, and constituents of the divalent manganese-doped all-inorganic perovskite quantum dot glass are as follows: $B_2O_3$: 25%-45%, $SiO_2$: 25%-45%, $MCO_3$: 1%-10%, $Al_2O_3$: 1%-10%, ZnO: 1%-5%, $Cs_2CO_3$: 1%-10%, $PbCl_2$: 1%-10%, NaCl: 1%-10%, $MnCl_2$: 1%-10%, wherein M is Ca, Sr or Ba. Preparation of the quantum dot glass is as follows: grinding each raw constituent materials and mixing well to form a mixture, melting the mixture, followed by molding, annealing and performing thermal treatment. By the thermal treatment at different temperatures, a divalent manganese-doped quantum dot glass can be obtained. The divalent manganese ions doped perovskite quantum dot glass is a kind of light-emitting material with great application prospect, for possessing good stability and rather high fluorescence quantum yield.

16 Claims, 6 Drawing Sheets

(51) Int. Cl.
    *C09K 11/02*     (2006.01)
    *C09K 11/66*     (2006.01)
    *H01L 31/055*     (2014.01)
    *H01L 33/50*     (2010.01)

(52) U.S. Cl.
    CPC ...... *C03C 2204/00* (2013.01); *C03C 2214/16* (2013.01); *C03C 2214/30* (2013.01); *H01L 31/055* (2013.01); *H01L 33/502* (2013.01)

(58) Field of Classification Search
    USPC .................................................. 252/301.6 F
    See application file for complete search history.

(56) References Cited

OTHER PUBLICATIONS

Sijin Liu, et al., "Novel CsPbI3 QDs glass with chemical stability and optical properties," Journal of the European Ceramic Society, vol. 38, Oct. 2017, pp. 1-7.

Meiling He, et al., "Mn-Doped cesium lead halide perovskite nanocrystals with dual-color emission for WLED," Dyes and Pigments, vol. 152, Jan. 2018, pp. 146-154.

Pengzhi Li, et al., "Novel synthesis and optical characterization of CsPb2Br5 quantum dots in borosilicate glasses," Materials Letters, vol. 209, Aug. 2017, pp. 483-485.

Sijin Liu, et al., "Precipitation and tunable emission of cesium lead halide perovskites (CsPbX3, X = Br, I) QDs in borosilicate glass," Ceramics International, vol. 44, Dec. 2017, pp. 1-4.

* cited by examiner

DIVALENT MANGANESE-DOPED ALL-INORGANIC PEROVSKITE QUANTUM DOT GLASS AND PREPARATION METHOD THEREOF

CROSS-REFERENCE TO RELATED APPLICATION

This application is a 371 application of International PCT application serial no. PCT/CN2018/080921, filed on Mar. 28, 2018. The entirety of each of the abovementioned patent application is hereby incorporated by reference herein and made a part of this specification.

BACKGROUND

Technical Field

The present invention relates to the field of luminescent materials, and particularly relates to a divalent manganese-doped all-inorganic perovskite quantum dot glass and a preparation method and application thereof.

Description of Related Art

All-inorganic perovskite quantum dot is a luminescent material with great potential of development. Particularly, $CsPbX_3$ (wherein X is Cl, Br and I) draws great attention due to several advantages such as a relatively high photoluminescence quantum yield (~90%), tunable emission in the entire visible spectral region (400-760 nm), a narrower emission linewidth (12 nm-42 nm), and etc. However, there are some drawbacks in the all-inorganic perovskite quantum dots synthesized by the liquid phase method, such as poor water resistance, low photoluminescence quantum yield of powder, poor heat resistance and light-aging resistance after preparing with the conventional organic package materials into a device, and thereby application as a photoelectric material in the field is significantly limited.

In order to overcome the above problems, it is of great need of synthesizing a quantum dot composite material with excellent luminescent property, chemical stability, heat resistance and light-resistance. Compared with the conventional organic package materials, glass is a suitable choice of host material, for it has property advantages such as good transparency, mechanical stability, chemical stability, heat resistance and water resistance, simple preparation process with low cost, being capable of preparing a block of optical element, and super high optical uniformity.

SUMMARY

The objective of the present invention is to provide a divalent manganese-doped all-inorganic perovskite quantum dot glass. Such manganese-doped quantum dot glass has good luminescent property, relatively high quantum yield and broad photoluminescence band.

Meanwhile, the present invention provides a preparation method of the divalent manganese-doped all-inorganic perovskite quantum dot glass above.

The objective of the present invention is achieved through the following technical solution:

The present invention provides a divalent manganese-doped all-inorganic perovskite quantum dot glass. By molar percentage, constituents of the divalent manganese-doped all-inorganic perovskite quantum dot glass are as follows: $B_2O_3$: 25%-45%, $SiO_2$: 25%-45%, $MCO_3$: 1%-10%, $Al_2O_3$: 1%-10%, ZnO: 1%-5%, $Cs_2CO_3$: 1%-10%, $PbCl_2$: 1%-10%, NaCl: 1%-10%, $MnCl_2$: 1%-10%.

Preferably, constituents of the divalent manganese-doped all-inorganic perovskite quantum dot glass are as follows: $B_2O_3$: 30%-40%, $SiO_2$: 30%-40%, $MCO_3$: 1%-10%, $Al_2O_3$: 1%-10%, ZnO: 1%-5%, $Cs_2CO_3$: 1%-10%, $PbCl_2$: 1%-10%, NaCl: 1%-10%, $MnCl_2$: 1%-10%.

Preferably, a ratio of $MnCl_2$ to $PbCl_2$ is more than 3:7 and less than 7:3.

Preferably, a sum of the molar percentages of $MCO_3$ and ZnO accounts for less than 10% of a total constituent of the glass.

Under the above preferable conditions, a divalent manganese-doped all-inorganic perovskite quantum dot glass with better luminescent performance can be obtained.

Meanwhile, the present invention provides a preparation method of the divalent manganese-doped all-inorganic perovskite quantum dot glass, including the following steps:

S1: grinding each constituent raw materials and mixing well to form a mixture, placing the mixture in a sealed crucible, performing melting treatment for a period of time t1 at a temperature of T1 in a reducing atmosphere, pouring a glass melt into a mold for molding, then annealing to obtain a transparent glass; and S2: performing thermal treatment of the transparent glass obtained in S1 for a period of time t2 at a temperature of T2, then cooling to room temperature, obtaining the divalent manganese-doped all-inorganic perovskite quantum dot glass by cutting and polishing;

the temperature T1 of the melting in S1 ranges between 1200° C. and 1400° C., and the period of time t1 of the melting is 10 minutes to 60 minutes;

the temperature T2 of the thermal treatment in S2 is 360° C. to 600° C., and the period of time t2 of the thermal treatment is 4 hours to 20 hours.

By means of a thermal treatment process on glass-ceramic in the present invention, perovskite quantum dot is precipitated inside the glass, and a divalent manganese-doped all-inorganic perovskite quantum dot glass with relatively high quantum yield and chemical stability is prepared. Such quantum dot glass is an optical conversion material which can be used in fields of white LED, plant-growth lighting and solar cells.

In the divalent manganese-doped all-inorganic perovskite quantum dot glass provided by the present invention, the divalent manganese has an excitation band covering from 250 nm to 400 nm, an emission band covering from 525 nm to 800 nm and peaking at 640 nm. Particularly, the emission band peaking at 403 nm to 408 nm belongs to $CsPbCl_3$.

Compared with the prior art, the present invention has the following beneficial effects:

The divalent manganese-doped all-inorganic perovskite quantum dot glass provided by the present invention has advantages such as excellent chemical stability, emission with high quantum yield and broad mission linewidth (100 nm), covering from 525 nm to 800 nm and peaking at 640 nm, homogeneous and stable product, simple process, low cost and quantity production availability. It can be used in the field of light-emitting and photovoltaic devices such as white LED, solar cells, plant-growth lighting, and etc., and other fields.

DESCRIPTION OF THE EMBODIMENTS

The present invention is further described by specific examples and accompanied drawings, but the examples do not limit the present invention in any ways. Unless specified, reagents, methods and devices used in the present invention are conventional reagents, methods and devices in the art.

Unless specified, reagents and materials used in the present invention are commercially available.

Example 1

Molar percentages of chemical constituents of a glass in the present example are as follows: $30B_2O_3$-$40SiO_2$-$5ZnO$-$7Al_2O_3$-$6Cs_2CO_3$-$4(Pb/Mn)Cl_2$-$4NaCl$-$4MCO_3$, wherein M is Sr.

TABLE 1

Material constituents of a divalent manganese-doped all-inorganic perovskite quantum dot glass of Example 1

| Material | $H_3BO_3$ | $SiO_2$ | $Al_2O_3$ | $Cs_2CO_3$ | $PbCl_2$ | $MnCl_2$ | NaCl | $SrCO_3$ | ZnO |
|---|---|---|---|---|---|---|---|---|---|
| Mass g | 12.9849 | 8.4118 | 2.4981 | 6.8422 | 1.9468 | 0.8809 | 0.8182 | 2.066 | 1.1397 |

Figure 1:
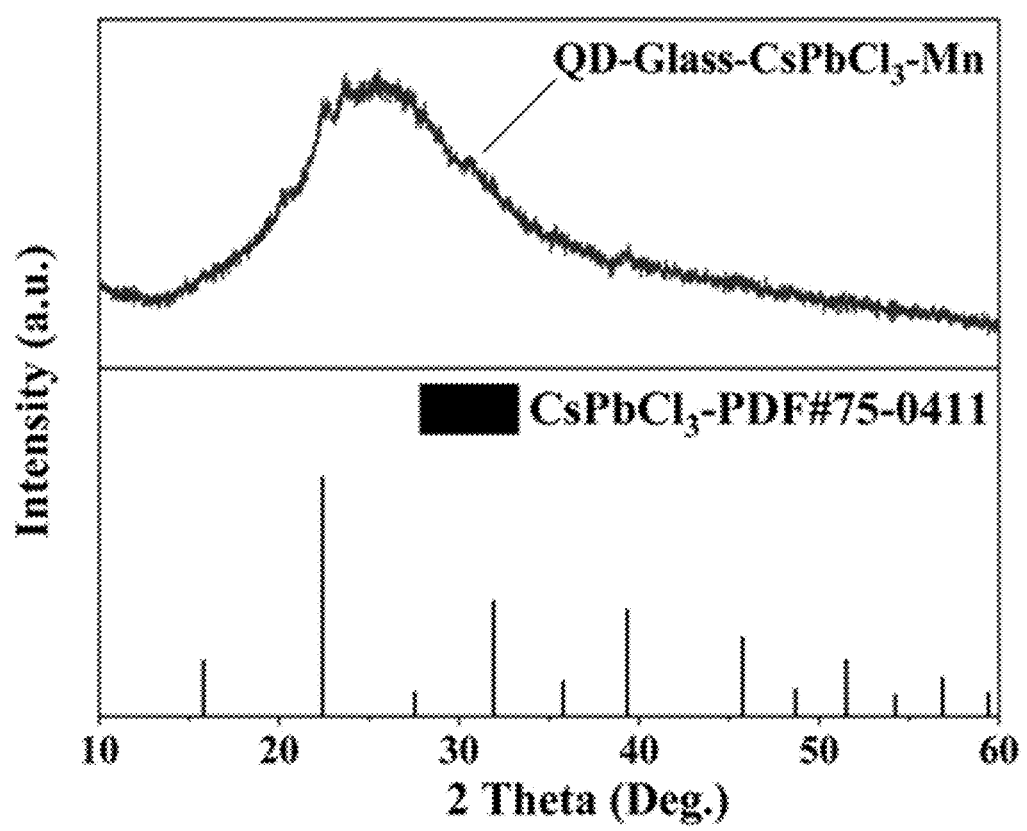
FIG. 1 is an XRD diagram of a $Mn^{2+}$-doped all-inorganic perovskite quantum dot glass prepared by thermal treatment at 500° C. for 10 hours in Example 1.

Mass of each compound correspondingly shown in Table 1 can be calculated according to the molar percentages of the chemical constituents of Example 1. Analytically pure $H_3BO_3$, $SiO_2$, $Al_2O_3$, $Cs_2CO_3$, $PbCl_2$, $MnCl_2$, NaCl, $SrCO_3$ and ZnO were accurately weighed according to Table 1. The materials accurately weighed were ground in an agate mortar for 1 to 2 hours, and transferred to a corundum crucible to be melted at 1200° C. for 30 minutes in reducing atmosphere. Then the melt was poured into a preheated graphite mold for molding, followed by being annealed in an annealing furnace at 360° C. for 4 hours. As the furnace was cooled, an original glass was obtained and denoted as QD-Glass-$CsPbCl_3$—Mn. The original glass was subsequently put in a thermal treatment furnace for thermal treatment respectively at 470° C.-550° C. for 10 to 20 hours. As the furnace was cooled to room temperature, a divalent manganese-doped all-inorganic perovskite quantum dot glass sample was obtained. The glass sample was cut into an appropriate thickness with a diamond linear cutter and polished until both sides became mirror surface, and then a satisfactory divalent manganese-doped all-inorganic perovskite quantum dot glass was achieved. Particularly, FIG. 1 is an XRD diagram of the divalent manganese-doped all-inorganic perovskite quantum dot glass synthesized by thermal treatment at 500° C. for 10 hours. It can be known from the figure that diffraction peaks present in the glass obtained by the thermal treatment respectively correspond to a cubic-phase $CsPbCl_3$ standard card PDF #75-0411, thereby indicating that the $CsPbCl_3$ perovskite quantum dots were precipitated inside the glass.

Example 2

Molar percentages of chemical constituents of a glass in the present example are as follows: $35B_2O_3$-$35SiO_2$-$4ZnO$-$7Al_2O_3$-$6Cs_2CO_3$-$4(Pb/Mn)Cl_2$-$4NaCl$-$5MCO_3$, wherein M is Ca.

TABLE 2

Material constituents of a divalent manganese-doped all-inorganic perovskite quantum dot glass of Example 2

| Material | $H_3BO_3$ | $SiO_2$ | $Al_2O_3$ | $Cs_2CO_3$ | $PbCl_2$ | $MnCl_2$ | NaCl | $SrCO_3$ | ZnO |
|---|---|---|---|---|---|---|---|---|---|
| Mass g | 15.1491 | 7.3603 | 2.4981 | 6.8422 | 1.9468 | 0.8809 | 0.8182 | 1.7515 | 1.1397 |

Figure 2:
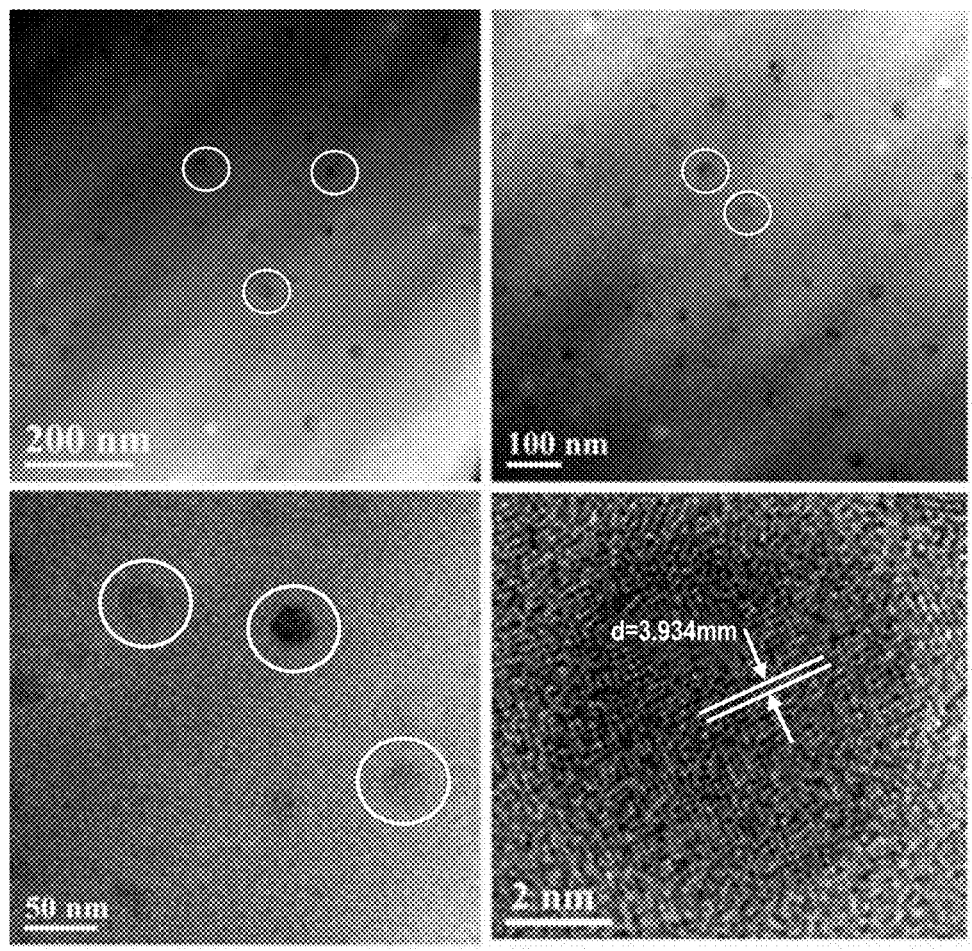
FIG. 2 is a TEM diagram of a $Mn^{2+}$-doped all-inorganic perovskite quantum dot glass prepared by thermal treatment at 515° C. for 15 hours in Example 2.

Mass of each compound correspondingly shown in Table 2 can be calculated according to the molar percentages of the chemical constituents of Example 2. Analytically pure $H_3BO_3$, $SiO_2$, $Al_2O_3$, $Cs_2CO_3$, $PbCl_2$, $MnCl_2$, NaCl, $CaCO_3$ and ZnO were accurately weighed according to Table 2. The materials accurately weighed were ground in an agate mortar for 1 to 2 hours, and transferred to a corundum crucible to be melted at 1300° C. for 30 minutes in reducing atmosphere. Then the melt was poured into a preheated graphite mold for molding, followed by being annealed in an annealing furnace at 360° C. for 4 hours. As the furnace was cooled, an original glass was obtained and denoted as QD-Glass-$CsPbCl_3$—Mn. The original glass was subsequently put in a thermal treatment furnace for thermal treatment respectively at 470° C.-550° C. for 10 to 20 hours. As the furnace was cooled to room temperature, a divalent manganese-doped all-inorganic perovskite quantum dot glass sample was obtained. The glass sample was cut into an appropriate thickness with a diamond linear cutter and polished until both sides became mirror surface, and then a satisfactory divalent manganese-doped all-inorganic perovskite quantum dot glass was achieved. Particularly, FIG. 2 is a TEM diagram of the divalent manganese-doped all-inorganic perovskite quantum dot glass synthesized by thermal treatment at 515° C. for 15 hours. It can be known from the figure that the $CsPbCl_3$ perovskite quantum dots precipitated inside the glass are crystals having a size of 8 nm-15 nm, and it can be seen from the high-resolution TEM that a lattice spacing of the quantum dot corresponds to a lattice plane of the $CsPbCl_3$ quantum dots (111), further indicating that the quantum dots synthesized are all-inorganic perovskite $CsPbCl_3$ quantum dot.

Example 3

Molar percentages of chemical constituents of a glass in the present example are as follows: $34B_2O_3$-$38SiO_2$-$4ZnO$-$5Al_2O_3$-$6Cs_2CO_3$-$4(Pb/Mn)Cl_2$-$4NaCl$—$5MCO_3$, wherein M is Sr.

TABLE 3

Material constituents of a divalent manganese-doped all-inorganic perovskite quantum dot glass of Example 3

| Material | $H_3BO_3$ | $SiO_2$ | $Al_2O_3$ | $Cs_2CO_3$ | $PbCl_2$ | $MnCl_2$ | NaCl | $SrCO_3$ | ZnO |
|---|---|---|---|---|---|---|---|---|---|
| Mass g | 14.7163 | 7.9912 | 1.7843 | 6.8422 | 1.7522 | 0.5285 | 0.8182 | 2.5835 | 1.1397 |

Figure 3:
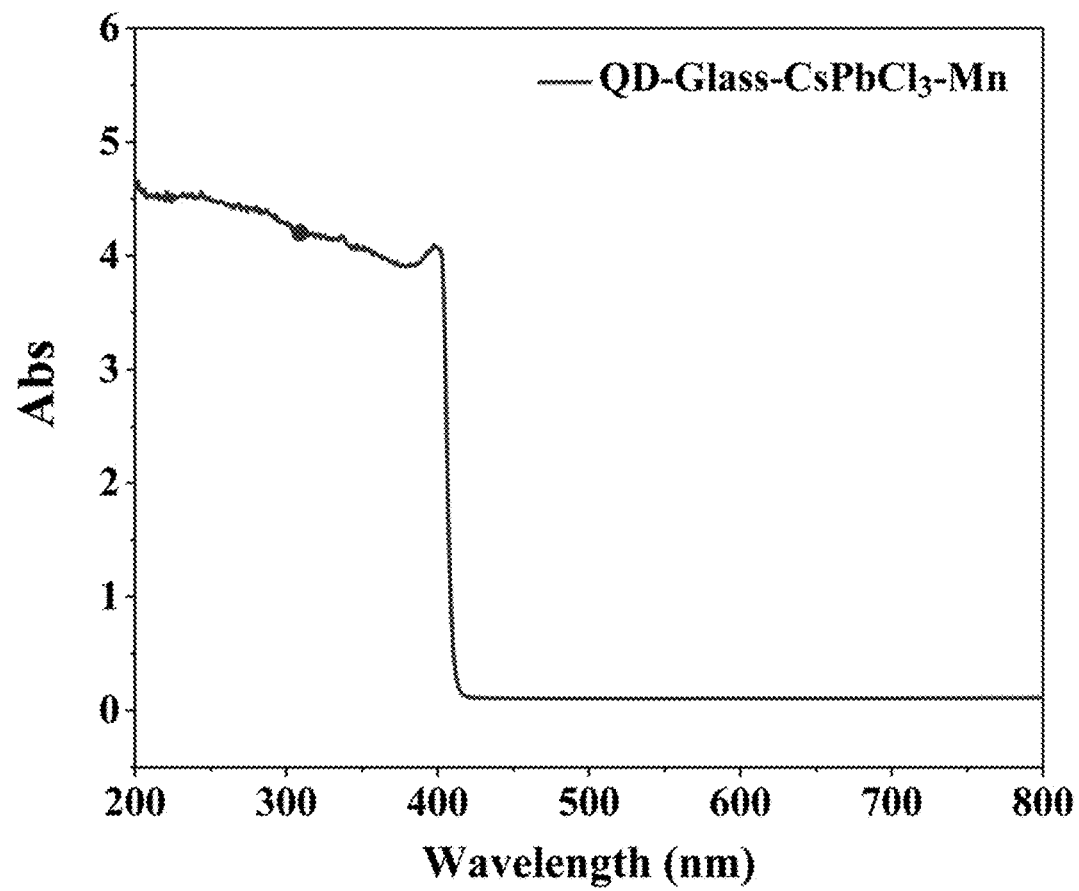
FIG. 3 is an absorption spectrum of a $Mn^{2+}$-doped all-inorganic perovskite quantum dot glass prepared by thermal treatment at 520° C. for 20 hours in Example 3.

Mass of each compound correspondingly shown in Table 3 can be calculated according to the molar percentages of the chemical constituents of Example 3. Analytically pure $H_3BO_3$, $SiO_2$, $Al_2O_3$, $Cs_2CO_3$, $PbCl_2$, $MnCl_2$, NaCl, $SrCO_3$ and ZnO were accurately weighed according to Table 3. The materials accurately weighed were ground in an agate mortar for 1 to 2 hours, and transferred to a corundum crucible to be melted at 1250° C. for 30 minutes in reducing atmosphere. Then the melt was poured into a preheated graphite mold for molding, followed by being annealed in an annealing furnace at 360° C. for 4 hours. As the furnace was cooled, an original glass was obtained and denoted as QD-Glass-CsPbCl$_3$—Mn. The original glass was subsequently put in a thermal treatment furnace for thermal treatment respectively at 470° C.-550° C. for 10 to 20 hours. As the furnace was cooled to room temperature, a divalent manganese-doped all-inorganic perovskite quantum dot glass sample was obtained. The glass sample was cut into an appropriate thickness with a diamond linear cutter and polished until both sides became mirror surface, and then a satisfactory divalent manganese-doped all-inorganic perovskite quantum dot glass was achieved. Particularly, FIG. 3 is an absorption spectrum of the divalent manganese-doped all-inorganic perovskite quantum dot glass obtained by thermal treatment at 520° C. for 10 hours. It can be known from the figure that absorption spectrum of the glass obtained by thermal treatment are similar to those of the CsPbCl$_3$ quantum dots synthesized by the liquid phase method in the references, also indicating that the quantum dots precipitated inside the glass were CsPbCl$_3$ quantum dots.

Example 4

Molar percentages of chemical constituents of a glass in the present example are as follows: $32B_2O_3$-$38SiO_2$-$3ZnO$—$7Al_2O_3$-$8Cs_2CO_3$-$3(Pb/Mn)Cl_2$-$3NaCl$—$6MCO_3$, wherein M is Ba.

TABLE 4

Material constituents of a divalent manganese-doped all-inorganic perovskite quantum dot glass of Example 4

| Material | $H_3BO_3$ | $SiO_2$ | $Al_2O_3$ | $Cs_2CO_3$ | $PbCl_2$ | $MnCl_2$ | NaCl | $BaCO_3$ | ZnO |
|---|---|---|---|---|---|---|---|---|---|
| Mass g | 13.8504 | 7.9912 | 2.4981 | 9.1230 | 2.0442 | 0.8809 | 0.3964 | 4.1441 | 0.8548 |

Figure 4:
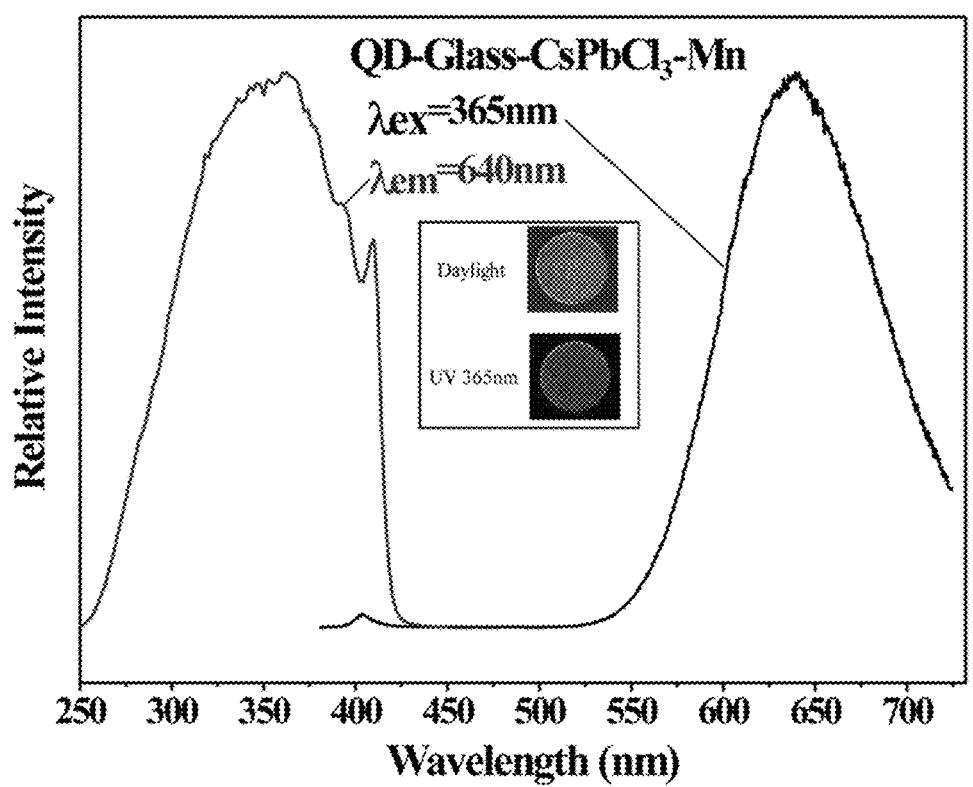
FIG. 4 shows pictures of a product in ambient and under 365 nm UV lamp illumination (inset), and excitation ($\lambda_{ex}$=365 nm) and emission ($\lambda_{em}$=640 nm) spectrum of a $Mn^{2+}$-doped all-inorganic perovskite quantum dot glass prepared by thermal treatment at 530° C. for 10 hours in Example 4.

Mass of each compound correspondingly shown in Table 4 can be calculated according to the molar percentages of the chemical constituents of Example 4. Analytically pure $H_3BO_3$, $SiO_2$, $Al_2O_3$, $Cs_2CO_3$, $PbCl_2$, $MnCl_2$, NaCl, $BaCO_3$ and ZnO were accurately weighed according to Table 4. The materials accurately weighed were ground in an agate mortar for 1 to 2 hours, and transferred to a corundum crucible to be melted at 1350° C. for 30 minutes in reducing atmosphere. Then the melt was poured into a preheated graphite mold for molding, followed by being annealed in an annealing furnace at 360° C. for 4 hours. As the furnace was cooled, an original glass was obtained and denoted as QD-Glass-CsPbCl$_3$—Mn. The original glass was subsequently put in a thermal treatment furnace for thermal treatment respectively at 470° C.-550° C. for 10 to 20 hours. As the furnace was cooled to room temperature, a divalent manganese-doped all-inorganic perovskite quantum dot glass sample was obtained. The glass sample was cut into an appropriate thickness with a diamond linear cutter and polished until both sides became mirror surface, and then a satisfactory divalent manganese-doped all-inorganic perovskite quantum dot glass was achieved. Particularly, FIG. 4 is an excitation and emission spectrum of the divalent manganese-doped all-inorganic perovskite quantum dot glass obtained by thermal treatment at 530° C. for 10 hours. It can be known from the figure that the excitation and emission spectrum of the glass obtained by thermal treatment is similar to that of the Mn$^{2+}$-doped CsPbCl$_3$ quantum dots synthesized by the liquid phase method in the references, also indicating that the quantum dots precipitated inside the glass might be Mn$^{2+}$-doped CsPbCl$_3$ quantum dot. The Mn$^{2+}$-doped CsPbCl$_3$ quantum dots in the glass synthesized in the present invention have relatively good chemical stability due to the glass host. The sample has an emission wavelength covering from 525 nm to 800 nm, peaking at 640 nm with emission linewidth of 100 nm, and a photoluminescence quantum yield of 23.6%.

TABLE 5

Internal quantum yield, absorption rate and external quantum yield of the sample synthesized in Example 4

| Sample | IQY | Abs | EQY |
|---|---|---|---|
| QD-Glass-CsPbCl$_3$—Mn | 0.236 | 0.894 | 0.211 |

Example 5

Molar percentages of chemical constituents of a glass in the present example are as follows: $34B_2O_3\text{-}38SiO_2\text{-}6ZnO\text{—}5Al_2O_3\text{-}8Cs_2CO_3\text{-}3(Pb/Mn)Cl_2\text{-}3NaCl\text{—}3MCO_3$, wherein M is Ba.

TABLE 6

Material constituents of a divalent manganese-doped all-inorganic perovskite quantum dot glass of Example 5

| Material | $H_3BO_3$ | $SiO_2$ | $Al_2O_3$ | $Cs_2CO_3$ | $PbCl_2$ | $MnCl_2$ | NaCl | $BaCO_3$ | ZnO |
|---|---|---|---|---|---|---|---|---|---|
| Mass g | 14.7163 | 7.9912 | 1.7843 | 6.8422 | 1.4601 | 0.6607 | 0.6136 | 2.0720 | 1.7096 |

Figure 5:
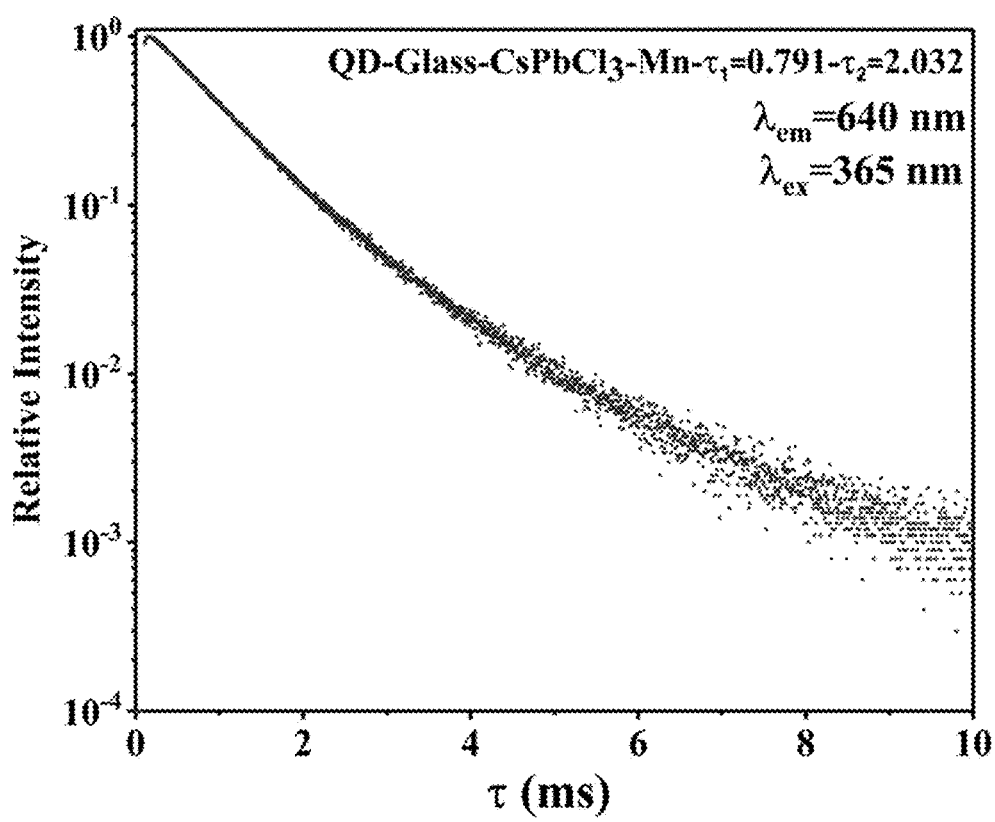
FIG. 5 is a lifetime curve of a $Mn^{2+}$-doped all-inorganic perovskite quantum dot glass prepared by thermal treatment at 530° C. for 20 hours in Example 5.

Mass of each compound correspondingly shown in Table 6 can be calculated according to the molar percentages of the chemical constituents of Example 5. Analytically pure $H_3BO_3$, $SiO_2$, $Al_2O_3$, $Cs_2CO_3$, $PbCl_2$, $MnCl_2$, NaCl, $BaCO_3$ and ZnO were accurately weighed according to Table 6. The materials accurately weighed were ground in an agate mortar for 1 to 2 hours, and transferred to a corundum crucible to be melted at 1400° C. for 30 minutes in reducing atmosphere. Then the melt was poured into a preheated graphite mold for molding, followed by being annealed in an annealing furnace at 360° C. for 4 hours. As the furnace was cooled, an original glass was obtained and denoted as QD-Glass-$CsPbCl_3$—Mn. The original glass was subsequently put in a thermal treatment furnace for thermal treatment respectively at 470° C.-550° C. for 10 to 20 hours. As the furnace was cooled to room temperature, a divalent manganese-doped all-inorganic perovskite quantum dot glass sample was obtained. The glass sample was cut into an appropriate thickness with a diamond linear cutter and polished until both sides became mirror surface, and then a satisfactory divalent manganese-doped all-inorganic perovskite quantum dot glass was achieved. Particularly, FIG. 5 is a lifetime curve of the divalent manganese-doped all-inorganic perovskite quantum dot glass obtained by thermal treatment at 530° C. for 20 hours. It can be known from the figure that the lifetime of the $Mn^{2+}$ ions inside the glass is similar to that of the $Mn^{2+}$-doped $CsPbCl_3$ quantum dots synthesized by the liquid phase method in the references, further indicating that the quantum dots precipitated inside the glass might be $Mn^{2\pm}$-doped $CsPbCl_3$ quantum dot glass.

Comparative Example 1

Molar percentages of chemical constituents of a glass in the present comparative example are as follows: $33B_2O_3\text{-}38SiO_2\text{-}10ZnO\text{—}5Al_2O_3\text{-}8Cs_2CO_3\text{-}3(Pb/Mn)Cl_2\text{-}3NaCl$.

TABLE 7

Material constituents of a divalent manganese-doped glass of Comparative Example 1

| Material | $H_3BO_3$ | $SiO_2$ | $Al_2O_3$ | $Cs_2CO_3$ | $PbCl_2$ | $MnCl_2$ | NaCl | ZnO |
|---|---|---|---|---|---|---|---|---|
| Mass g | 14.7163 | 7.9912 | 1.7843 | 6.8422 | 2.3362 | 0.2643 | 0.6136 | 2.8493 |

Figure 6:
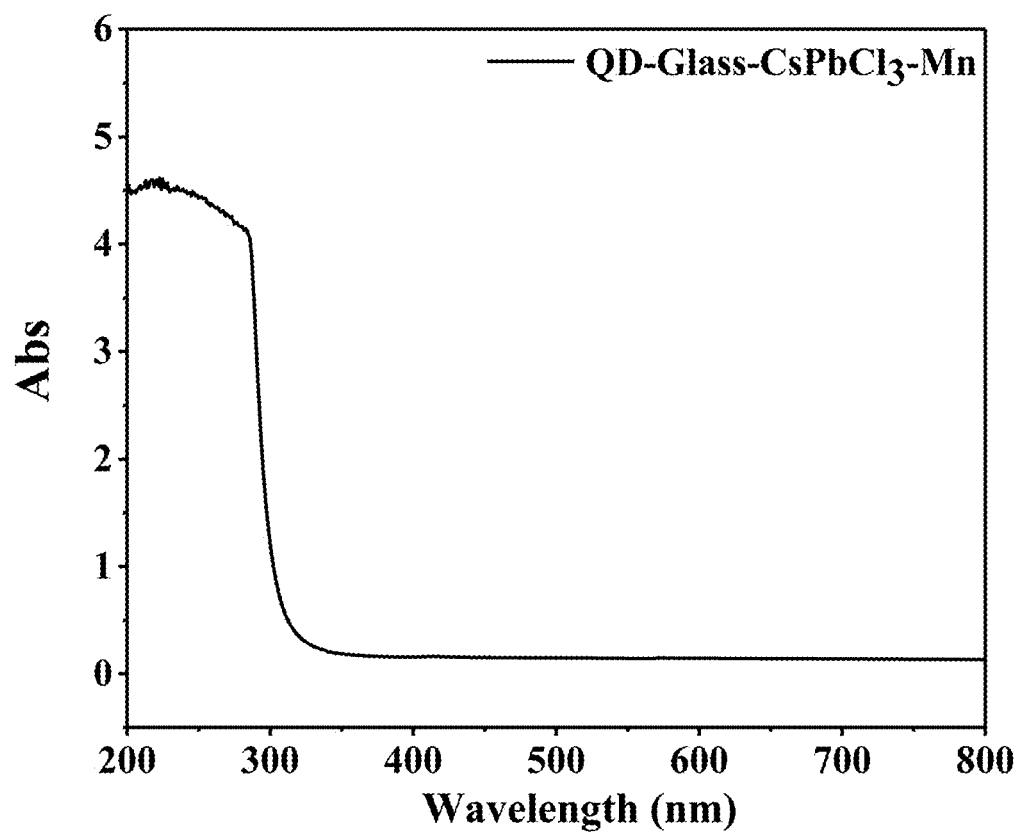
FIG. 6 shows absorption spectrum of a divalent manganese-doped all-inorganic perovskite quantum dot glass synthesized by thermal treatment at 530° C. for 15 hours in the comparative example 1.

Mass of each compound correspondingly shown in Table 7 can be calculated according to the molar percentages of the chemical constituents of Comparative Example 1. Analytically pure $H_3BO_3$, $SiO_2$, $Al_2O_3$, $Cs_2CO_3$, $PbCl_2$, $MnCl_2$, NaCl and ZnO were accurately weighed according to Table 7. The materials accurately weighed were ground in an agate mortar for 1 to 2 hours, and transferred to a corundum crucible to be melted at 1250° C. for 30 minutes. Then the melt was poured into a preheated graphite mold for molding, followed by being annealed in an annealing furnace at 360° C. for 4 hours. As the furnace was cooled, an original glass was obtained and denoted as Glass-Mn. The original glass was subsequently put in a thermal treatment furnace for thermal treatment respectively at 470° C.-550° C. for 10 to 20 hours. As the furnace was cooled to room temperature, a manganese-doped glass was obtained. The glass was cut into an appropriate thickness with a diamond linear cutter and polished until both sides became mirror surface, and then a manganese-doped glass sample was achieved. Particularly, FIG. 6 is an absorption spectrum of the manganese-doped glass sample obtained by thermal treatment at 520° C. for 15 hours. It can be known from the figure that there's no absorption between 300 nm and 400 nm in the glass obtained by thermal treatment of Comparative Example 1, indicating that a divalent manganese-doped all-inorganic perovskite quantum dot glass cannot be synthesized by the constituents in Comparative Example 1.

What is claimed is:

1. A divalent manganese-doped all-inorganic perovskite quantum dot glass, wherein by molar percentage, constituents of the divalent manganese-doped all-inorganic perovskite quantum dot glass are as follows: $B_2O_3$: 25%-45%, $SiO_2$: 25%-45%, $MCO_3$: 1%-10%, $Al_2O_3$: 1%-10%, ZnO: 1%-5%, $Cs_2CO_3$: 1%-10%, $PbCl_2$: 1%-10%, NaCl: 1%-10%, $MnCl_2$: 1%-10%.

2. The divalent manganese-doped all-inorganic perovskite quantum dot glass according to claim 1, wherein by molar percentage, constituents of the divalent manganese-doped all-inorganic perovskite quantum dot glass are as follows: $B_2O_3$: 30%-40%, $SiO_2$: 30%-40%, $MCO_3$: 1%-10%, $Al_2O_3$: 1%-10%, ZnO: 1%-5%, $Cs_2CO_3$: 1%-10%, $PbCl_2$: 1%-10%, NaCl: 1%-10%, $MnCl_2$: 1%-10%.

3. The divalent manganese-doped all-inorganic perovskite quantum dot glass according to claim 1, wherein a molar ratio of $MnCl_2$ to $PbCl_2$ is more than 3:7 and less than 7:3.

4. The divalent manganese-doped all-inorganic perovskite quantum dot glass according to claim 1, wherein a sum of the molar percentages of $MCO_3$ and ZnO accounts for less than 10% of a total constituent of the glass.

5. A preparation method of the divalent manganese-doped all-inorganic perovskite quantum dot glass according to claim 1, wherein the preparation method comprises the following steps:

S1: grinding each constituent raw materials and mixing well, placing in a sealed container, performing melting treatment for a period of time t1 at a temperature of T1 in a reducing atmosphere, followed by molding, and annealing to obtain a transparent glass; and S2: performing thermal treatment of the transparent glass obtained in S1 for a period of time t2 at a temperature of T2, then cooling to room temperature to obtain the divalent manganese-doped all-inorganic perovskite quantum dot glass;

the temperature T1 of the melting treatment in S1 ranges between 1200° C. and 1400° C., and the period of time t1 of the melting treatment is 10 minutes to 60 minutes;

the temperature T2 of the thermal treatment in S2 is 360° C. to 600° C., and the period of time t2 of the thermal treatment is 4 hours to 20 hours.

6. A method of preparing luminescent materials using the divalent manganese-doped all-inorganic perovskite quantum dot glass according to claim 1.

7. The method according to claim 6, wherein the divalent manganese-doped all-inorganic perovskite quantum dot glass is used as an optical conversion material in fields of white LED, plant-growth lighting and solar cells.

8. The divalent manganese-doped all-inorganic perovskite quantum dot glass according to claim 2, wherein a molar ratio of $MnCl_2$ to $PbCl_2$ is more than 3:7 and less than 7:3.

9. A method of preparing luminescent materials using the divalent manganese-doped all-inorganic perovskite quantum dot glass according to claim 8.

10. The method according to claim 9, wherein the divalent manganese-doped all-inorganic perovskite quantum dot glass is used as an optical conversion material in fields of white LED, plant-growth lighting and solar cells.

11. A method of preparing luminescent materials using the divalent manganese-doped all-inorganic perovskite quantum dot glass according to claim 2.

12. The method according to claim 11, wherein the divalent manganese-doped all-inorganic perovskite quantum dot glass is used as an optical conversion material in fields of white LED, plant-growth lighting and solar cells.

13. A method of preparing luminescent materials using the divalent manganese-doped all-inorganic perovskite quantum dot glass according to claim 3.

14. The method according to claim 13, wherein the divalent manganese-doped all-inorganic perovskite quantum dot glass is used as an optical conversion material in fields of white LED, plant-growth lighting and solar cells.

15. A method of preparing luminescent materials using the divalent manganese-doped all-inorganic perovskite quantum dot glass according to claim 4.

16. The method according to claim 15, wherein the divalent manganese-doped all-inorganic perovskite quantum dot glass is used as an optical conversion material in fields of white LED, plant-growth lighting and solar cells.

* * * * *